United States Patent [19]

Dorsey et al.

[11] 3,936,597
[45] Feb. 3, 9176

[54] VIDEO FREQUENCY AMPLIFIER OPERABLE IN EITHER OF TWO BIAS CONDITIONS

[75] Inventors: Denis Peter Dorsey, Levittown, Pa.; William E. Rodda, Trenton, N.J.

[73] Assignee: RCA Corporation, New York, N.Y.

[22] Filed: Sept. 19, 1973

[21] Appl. No.: 398,853

Related U.S. Application Data

[63] Continuation-in-part of Ser. No. 273,534, July 20, 1972, abandoned.

[30] Foreign Application Priority Data

Apr. 24, 1972 United Kingdom............... 19021/72

[52] U.S. Cl........ 178/6.8; 178/7.3 DC; 178/DIG. 24
[51] Int. Cl.² ........................ H04N 3/00; H04N 3/16
[58] Field of Search......... 178/DIG. 24, DIG. 3, 6.8, 178/7.3 DC, 5.6; 315/12, 13 ST, 21 MR; 330/17, 28, 29; 328/126, 124, 121

[56] References Cited
UNITED STATES PATENTS 2,629,010  2/1953   Graham ....................... 178/DIG. 3
2,813,148  11/1957  Pensak ........................ 178/DIG. 24
3,204,026  8/1965   Doundaulakis ................... 178/6.8
3,628,166  12/1971  Harford ............................ 330/29

Primary Examiner—Benedict V. Safourek
Assistant Examiner—R. John Godfrey
Attorney, Agent, or Firm—Eugene M. Whitacre; Mason DeCamillis

[57] ABSTRACT

A video frequency amplifier is biased to provide output signals of a first magnitude. In response to the application of a predetermined control signal, the bias is altered so that output signals are provided of a second, different magnitude. When employed in communications systems of the type in which television images are "frozen" by a storage tube for subsequent transmission on an individual frame basis by a voice-quality telephone link, for example, and subsequently re-created, the control signal indicates whether the system and its storage tube are to operate either in the "transmit" or "receive" mode.

7 Claims, 1 Drawing Figure

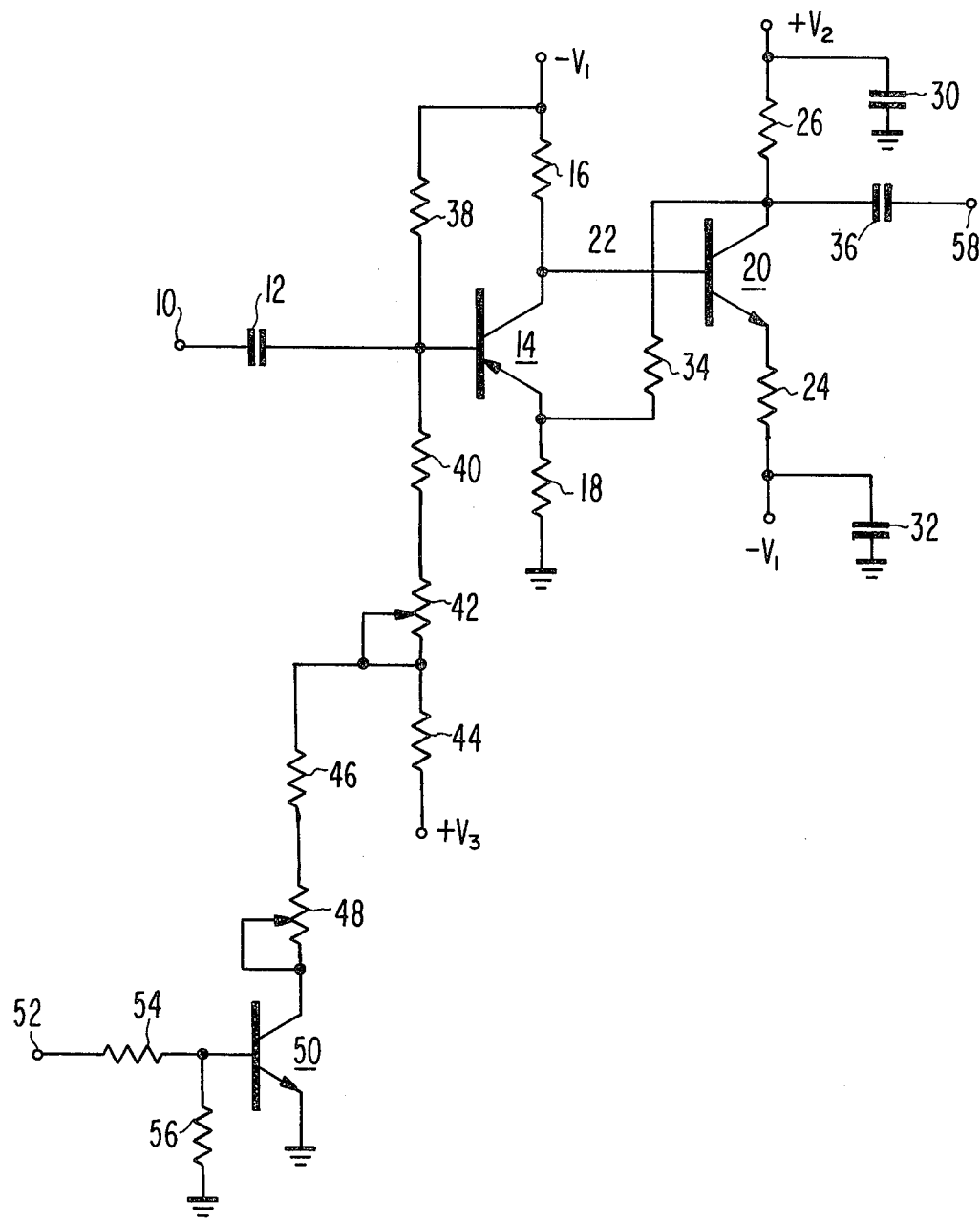

VIDEO FREQUENCY AMPLIFIER OPERABLE IN EITHER OF TWO BIAS CONDITIONS

This is a continuation-in-part of U.S. application Ser. No. 273,534, filed July 20, 1972, how abandoned.

FIELD OF THE INVENTION

Pending U.S. Pat. Application Ser. No. 257,412, now U.S. Pat. No. 3842199 filed May 26, 1972, and entitled "TELEPHONE IMAGE TRANSMISSION SYSTEM" (RCA 64,997) describes a system which is capable of transmitting still television pictures of three-dimensional objects over communications channels such as long-distance unequalized voice-grade telephone lines. A television camera is therein employed to continually provide a video signal to a storage tube in which one video frame of information can be "frozen" when an accompanying monitor indicates that the picture desired to be transmitted is then being picked up by the camera. The single frame stored is then converted to an audio frequency signal for transmission over audio channels to a remote receiver location where a second storage tube is used to record the audio frequency information transmitted. Upon completion of the transmission, the audio information converted back to a video signal for viewing on a second monitor.

Such a transmission system has been termed "simplex," in that transmissions always travel in the same direction along the audio link. In a "half-duplex" system, on the other hand, transmissions can proceed in either direction, but not simultaneously. Experimentation has shown that "half-duplex" system performance can be enhanced when the storage tube is biased to a first condition when the "transmit" mode of operation is intended and to a second, different condition when the "receive" mode of operation is desired.

To be more specific, when the storage tube is used to "freeze" a television frame for transmission, substantially the entire television picture is scanned and thereby stored across its target area in approximately one-thirtieth of a second. When the storage tube is used instead to re-create a transmission received by it from the telephone line, the amplitude modulated pulses received via the audio communications link complete the recording of the frame information in approximately 60 seconds. Each element of the storage tube target need be contacted only once to store the "frozen" before subsequent transmission; similarly each element must be scanned only once during the receipt mode of operation to assure that the entire frame information will be available at the end of the 60-second period. It will be appreciated, therefore, that unless the bias voltage for the storage tube were substantially lower in the "receive-re-create" mode as contrasted with the "select-transmit" mode, then over, the 60-second period, a series of charges would tend to accumulate on the target elements of the storage tube and would ultimately reduce the amount of usable information which could be laid down. It will similarly be appreciated that any resulting change thus made in bias voltage necessitates a concomitant change in applied signal level for correct storage tube operation to continue.

SUMMARY OF THE INVENTION

As will become clear hereinafter, the present invention comprises a video frequency amplifier which is coupled to apply image representative television signals to the storage tube of such a system as described above, whether the storage device is being used in selecting a television frame for transmission via an audio communications link or being used in re-creating the transmission along the audio link. The amplifier is biased to provide linear, Class A operation during the "frame-freeze" selection period, with the output signals being developed of a first magnitude. Means are included to sense whether the system is being used to transmit stored information or to receive transmitted information, and is designed to respond during the "audiolink" re-creation mode to alter the bias on the amplifier in a direction to increase the magnitude of its developed signals in cooperating with the simultaneous decrease in bias voltage on the storage tube.

As will also be seen such changes in signal amplitude can be effected through the use of different resistive divider networks, each operating to vary various amplifier bias voltages. When the amplifier is constructed of transistor stages, the divider networks may incorporate variable resistors to adjust for changes in transistor characteristics — and in other component values for that matter — over periods of time. While the use of differing resistive networks can be employed to adjust the output signal of a single amplifier stage, a pair of amplifier stages is included in the preferred embodiment of the invention hereafter described in order to provide a sufficiently broad response for both the "frame-freeze" select and "audio-link" re-create modes of storage tube system operation.

BRIEF DESCRIPTION OF THE DRAWING

These and other features of the present invention will be more clearly understood from a consideration of the following description taken in connection with the accompanying drawing which shows a preferred embodiment of a video frequency amplifier constructed in accordance with the invention.

DETAILED DESCRIPTION OF THE DRAWING

In the drawing, the signal to be stored—either from the television camera prior to transmission as a "frame-freeze" image or from the audio communications link telephone line to be re-created—is applied via an input terminal 10 and a capacitor 12 to the base electrode of a first transistor 14, shown as being of P-N-P type. The collector electrode of transistor 14 is coupled via a resistor 16 to a first source of operating potential $-V_1$, while its emitter electrode is coupled via a resistor 18 to a point of reference or ground potential. A second transistor 20, of N-P-N type, is also included, with its base electrode being directly coupled by means of a link 22 to the collector electrode of transistor 14 and with its emitter electrode being coupled by means of a resistor 24 to the $-V_1$ potential source. A resistor 26 serially couples the collector electrode of transistor 20 to a second source of operating potential $+V_2$, which source is bypassed to ground by a capacitor 30, a similar capacitor 32 being included to bypass the $-V_1$ source to ground also. Negative feedback around the two transistor stages are provided by means of a resistor 34 which couples the collector electrode of transistor 20 to the emitter electrode of transistor 14. A capacitor 36 is included to couple the collector electrode of transistor 20 via an output terminal 58 to the control grid electrode of the storage tube, by means of a direct current restorer circuit and follower stage (not shown)

to provide drive for the tube and add a proper direct current bias level for its operation.

In accordance with the present invention, a pair of resistive divider circuits are further included to bias the transistor stages 14 and 20 to either one of two conditions. The first divider circuit includes the series connection of resistor 38, resistor 40, resistor 42 and resistor 44 coupled between the $-V_1$ potential source and a third potential source $+V_3$, with the junction between resistors 38, 40 being directly connected to the base electrode of transistor 14. As will be seen below, this divider network is effective to establish a first bias voltage condition for the amplifier configuration and thereby a linear Class A operating condition.

The second divider circuit, on the other hand, includes further resistors 46 and 48, which are serially coupled between the junction between resistors 42, 44 and the collector electrode of a third transistor 50, the emitter electrode of which is grounded. Control signals for the transistor 50—of N-P-N type—are applied at a terminal 52 and coupled to the base electrode of this transistor by a resistive divider network including resistors 54 and 56. Such control signals will be seen to place transistor 50 in one of two states of conductivity depending upon whether the storage tube system is being used to select and transmit television frame information, or to receive and re-create such information communicated along the audio link. It will be noted that the second divider circuit is responsive to these control signals to alter the bias voltage condition for the amplifier configuration and thereby the amplifier is biased Class B enabling the development of an increased impulse output signal.

Lastly, resistors 42 and 48 are shown variable in order to provide a means of varying the bias voltages established to compensate for variations in component characteristics, either with time and/or with temperature.

The arrangement of the drawing will be seen to essentially comprise a cascade connected feedback pair with a P-N-P transistor amplifier stage driving an N-P-N transistor power stage. The negative voltage feedback provided by resistor 34 is such as to make the output signal an exact replica of the input signal; increase the input impedance and reduce the output impedance, whereas the variable resistors 42 and 48 serve to control the linear operation point of the N-P-N power stage. In one construction of the invention, appropriate logic circuitry (not shown) senses the mode of storage tube operation either to render transistor 50 nonconductive during the "frame-freeze" select mode of operation or to render it conductive during the "audio-link" re-create mode. During the "frame-freeze" select condition, the direct voltage developed at the collector electrode of transistor 20 is set by the values of divider circuit resistors 38, 40, 42, 44 and the values of potential sources $-V_1$ and $+V_3$—and further by the component values set forth in the tabularization at the end of this description—at approximately +10 volts with respect to ground. Linear, Class A operation of the amplifier will result at this voltage setting, and a video, modulating signal of some 10 volts peak-to-peak is developed by transistor 20, the most positive excursions extending to "white" in the image signal and the most negative excursions extending to "black." The direct current restorer and follower circuit which subsequently couple transistor 20 to the control grid of the storage tube are designed to bias that electrode at approximately $-65$ volts, also measured against ground, such that "white," at the storage tube grid, corresponds to a substantial $-55$ volt level, while "black" corresponds to a substantial $-65$ volt level.

In order to prevent the accumulation of charge which might develop on the target elements of the storage tube when that device is operating instead in its "audio-link" re-create mode, it has been observed that the control grid should be reduced in bias from this $-65$ volt level to a $-100$ volt level. At the same time, the applied signal swing should increase from the 10 volt amount to approximately a 45 volt amplitude to overcome the change in bias in causing the storage tube to conduct. To accomplish this latter objective of increasing the dynamic range provided requires a change be made in the bias condition of the amplifier, which change is in a direction to reduce the direct current quiescent level at the collector electrode of transistor 20 from the previous +10 volts towards 0 volts. Noting that the transistor 50 becomes conductive at this time, by the application of a positive control signal at terminal 52 when the switch-over to the audio communications mode of operation occurs, the resistor divider 46, 48 then serves to affect the desired change in bias level at the base electrode of transistor 14. It will be remembered in this respect that resistors 42 and 48 could be maintained of fixed value to achieve this same result but, instead, are made variable so as to compensate for variations in component values. While the feedback continues to limit the signal swing at the collector electrode of transistor 20, the ensuing result with this arrangement increasing the bias on transistor 14 and reducing the direct current level at the collector of transistor 20, permits the developed signal swing to increase from about 10 volts to about 45 volts. It has also been noted that the change from a Class A to this Class B operation of the amplifier stage once the direct current level is changed from +10 volts to approximately 0 volts does not have any effect on the reproduction of the image signals eventually re-created on the storage tube target; the most positive signal excursions still extend to "white," at the storage tube grid, at a substantial $-55$ volt level while, in this case, the most negative excursions extend to "black" at a $-100$ volt setting. It will be apparent that this change occurs automatically as modes of operation are switched, and is thus preferable over an arrangement in which only a single variable divider network is employed wherein adjustment would continually be needed as switch-over takes place.

In one particular design of the invention, the control signal applied at terminal 52 to indicate the "frame-freeze" select mode of operation was 0 volts while a +3 volt signal was used to indicate an "audio-link" re-create type of operation. While applicant does not wish to be limited to any particular set of values the following have proven satisfactory in one operating arrangement of the invention.

| Component | Value |
| --- | --- |
| Resistor 16 | 360Ω |
| Resistor 18 | 82Ω |
| Resistor 24 | 100Ω |
| Resistor 26 | 1.5K |
| Resistor 34 | 5.1K |
| Resistor 38 | 7.5K |
| Resistor 40 | 7.5K |
| Resistor 42 | 2.5K |
| Resistor 44 | 1.0K |

-continued

| Component | Value |
| --- | --- |
| Resistor 46 | 5.6K |
| Resistor 48 | 25K |
| Resistor 54 | 2.2K |
| Resistor 56 | 10K |
| Capacitor 12 | 25µf |
| Capacitor 30 | 0.33µf |
| Capacitor 32 | 0.33µf |
| Capacitor 36 | 0.47µf |
| Transistor 14 | RCA 3620 |
| Transistor 20 | 2N3119 |
| Transistor 50 | RCA 3601 |
| Potential Source $-V_1$ | −15 volts |
| Potential Source $+V_2$ | +75 volts |
| Potential Source $+V_3$ | +15 volts |

While there has been described what is considered to be a preferred embodiment of the present invention for amplifying input signals referenced to two different direct current levels, it will be readily apparent that other modifications may be made by those skilled in the art without departing from the teachings herein. Thus, while it might be possible to replace the two transistor amplifiers 14, 20 with one transistor only, it would be appreciated that two devices are used herein—and of opposite polarity type—so that the first transistor 14 can be used to provide an amplified signal for the output stage 20 and so that any temperature change which might effect the base-emitter junction of one transistor will be equally offset by an appropriate direction change in the junction of the other transistor in order to hold the output bias voltage substantially constant with temperature variation. It has also been noted that construction of such a circuit with only a single transistor stage was not sufficiently able to provide a broad enough response so that the amplifier which resulted could be used both in its two intended modes of operation. A reduced power dissipation will also be seen to result when the amplfier is switched to its "audio-link" re-create mode due to the reduction in quiescent voltage at the collector electrode of transistor 20. Thus, the scope of the present invention should be read in connection with the appended claims—and in connection with the intended purpose of the invention of biasing the storage tube employed well below cut-off for the "receive-re-create" mode of operation so as to prevent accumulation of charge on the storage tube element while, at the same time, increasing the amplitude of the output signal developed so as to compensate for this bias change.

What is claimed is:

1. In a television image transmission system of the type wherein a single storage device is employed both for the selection of a particular frame of television information for transmission to a remote receiver location by an audio communications link and for the reception and re-creation of frame information so transmitted, the combination therewith of:

an amplifier stage having an input terminal to which image representative television information is supplied and an output terminal at which amplified versions of said image representative information is developed for application to said storage device for the selection or re-creation of said information dependent upon when said device is operating within said system in the transmitting or receiving mode;

first means for biasing said amplifier stage to develop amplified image representative signals of a first magnitude at its output terminal referenced to a first direct current level;

second means for biasing said amplifier stage to develop amplified image representative signals of a second, different magnitude at its output terminal referenced to a second, different direct current level;

and control means coupled to said first and second biasing means for conditioning at least one of said biasing means to operation to set the magnitude of developed amplified signals and the direct current level to which said amplified signals are referenced; said control means also being dependent upon the mode of operation of said storage device within said television image transmission system to establish Class A amplifier operation and said first signal magnitude and direct current level as a reference when said storage device is employed to select a particular television frame for transmission and to establish Class B amplifier operation and said second signal magnitude and direct current level as a reference when said storage device is employed to re-create a television frame received along said audio communications link.

2. The combination of claim 1 wherein said amplifier stage includes a pair of transistors coupled in cascade connected, grounded emitter amplifier configurations.

3. The combination of claim 2 wherein said pair of transistors are of opposite polarity type.

4. The combination of claim 3 wherein a negative feedback path is included between a collector electrode of the output one of said pair of cascade connected transistors and the emitter electrode of the input one of said pair of transistors.

5. The combination of claim 2 wherein each of said first and second biasing means include resistive divider networks coupled to vary the bias voltage applied to a base electrode of said input transistor of said cascade connected pair.

6. The combination of claim 5 wherein said first biasing means is coupled to the base electrode of said input transistor of said cascade connected pair, wherein said second biasing means is coupled at one point to said first biasing means and at a second point to said control means, and wherein said control means includes a third transistor which is rendered to a first conductivity state when said storage device is employed in selecting a particular television frame for transmission and to a second conductivity state when said storage device is employed in re-creating a television frame received along said audio communications link, said first conductivity condition of said third transistor being effective to electrically decouple said second biasing means from said first biasing means and said second conductivity condition of said third transistor being effective to electrically couple said second biasing means in shunt with at least a portion of said first biasing means.

7. The combination of claim 6 wherein said first transistor of said cascade connected pair is of P-N-P polarity type and wherein said second transistor of said cascade connected pair and said third transistor are of N-P-N polarity type.

* * * * *

UNITED STATES PATENT OFFICE
CERTIFICATE OF CORRECTION

PATENT NO. : 3,936,597
DATED : February 3, 1976
INVENTOR(S) : Denis P. Dorsey & William E. Rodda It is certified that error appears in the above-identified patent and that said Letters Patent are hereby corrected as shown below:

In the Issue Date [45] - "Feb. 3, 9176" should read
-- Feb. 3, 1976 -- .

In the Specification:

Column 1, Line 6 - "how abandoned" should read -- now abandoned -- .

Column 1, Line 49 - "zen' before" should read -- zen" picture before -- .

Signed and Sealed this eighth Day of June 1976

[SEAL]

Attest:

RUTH C. MASON
*Attesting Officer*

C. MARSHALL DANN
*Commissioner of Patents and Trademarks*